United States Patent
Lan

(10) Patent No.: US 9,581,393 B2
(45) Date of Patent: Feb. 28, 2017

(54) PHASE-CHANGE HEAT DISSIPATION DEVICE AND LAMP

(71) Applicant: ARC Solid-State Lighting Corporation, New Taipei (TW)

(72) Inventor: Hai Lan, New Taipei (TW)

(73) Assignee: ARC SOLID-STATE LIGHTING CORPORATION, New Taipei (TW)

( * ) Notice: Subject to any disclaimer, the term of this patent is extended or adjusted under 35 U.S.C. 154(b) by 54 days.

(21) Appl. No.: 14/818,989

(22) Filed: Aug. 5, 2015

(65) Prior Publication Data

US 2016/0356551 A1    Dec. 8, 2016

(30) Foreign Application Priority Data

Jun. 5, 2015 (TW) .............................. 104118278 A

(51) Int. Cl.
| | | |
|---|---|---|
| F21V 29/51 | (2015.01) | |
| F28D 15/02 | (2006.01) | |
| F21V 29/58 | (2015.01) | |
| F21V 29/503 | (2015.01) | |
| F21V 29/71 | (2015.01) | |

(52) U.S. Cl.
CPC .......... *F28D 15/025* (2013.01); *F21V 29/503* (2015.01); *F21V 29/58* (2015.01); *F21V 29/713* (2015.01); *F28D 15/0266* (2013.01)

(58) Field of Classification Search
CPC ...... F21V 29/006; F21V 29/508; F21V 29/58; F21V 29/713; F28D 15/025
See application file for complete search history.

(56) References Cited

U.S. PATENT DOCUMENTS 9,273,861 B2 * 3/2016 Ghiu .................... F21V 29/006
2011/0267815 A1 * 11/2011 Ghiu .................... F21V 29/006
362/235

* cited by examiner

*Primary Examiner* — Karabi Guharay
(74) *Attorney, Agent, or Firm* — Maschoff Brennan

(57) ABSTRACT

A phase-change heat dissipating device includes a heat absorbing body, a heat dissipation body and two tubes. The heat absorbing body is filled with a working fluid. A light source and the heat dissipation body are disposed on a same side of the heat absorbing body. The heat dissipation body has a light transmitting space which is corresponding to the light source. The tubes connect the heat absorbing body and the heat dissipation body. When the heat dissipation body is located higher than the heat absorbing body and the working fluid absorbs the heat energy generated from the light source, the working fluid is evaporated from liquid phase to gas phase and flows into the heat dissipation body through the tubes. The working fluid locating in the heat dissipation body is condensed from gas phase into liquid phase and flows to the heat absorbing body through the tubes.

12 Claims, 6 Drawing Sheets

PHASE-CHANGE HEAT DISSIPATION DEVICE AND LAMP

CROSS-REFERENCE TO RELATED APPLICATIONS

This non-provisional application claims priority under 35 U.S.C. §119(a) on Patent Application No(s). 104118278 filed in Taiwan, R.O.C. on Jun. 5, 2015, the entire contents of which are hereby incorporated by reference.

TECHNICAL FIELD

The disclosure relates to a phase-change heat dissipating device and a lamp, more particularly to a phase-change heat dissipating device and a lamp that can be oriented in different positions.

BACKGROUND

Light emitting diodes (LEDs) have superior characteristics such as low power consumption, high-energy conversion efficiency, long lifespan, and no mercury pollution, thereby taking the advantage over incandescent lights. However, the conventional LED has a deficiency in its capability of heat dissipation, thus the incandescent light cannot be totally replaced by the conventional LED yet.

For example, a heat sink is usually used for transferring heat energy away from a conventional LED lamp. However, the heat sink alone is not sufficient to remove enough heat energy generated from the LEDs. Thus, developers constantly try to improve the heat dissipating efficiency of the heat dissipating device in order to cool the LEDs. For example, the heat dissipating efficiency of the heat dissipating device can be improved by using the principle of phase-change heat dissipation.

However, even though the heat dissipating efficiency of the heat dissipating device is able to be improved according to the principle of phase-change heat dissipation, but once the heat dissipating device, which is placed upside down, is unable to exert phase-change heat dissipation because gas tends to rise up, thereby restricting how the lamp including the phase-change heat dissipating device is installed and illuminated. That is, the lamp which is exclusively designed for illuminating downward to the ground is not adapted for illuminating upward, leftward or rightward. Therefore, developers try to solve the problem that the position of the lamp with the phase-change heat dissipating device is restricted.

SUMMARY

In one embodiment, a phase-change heat dissipating device includes a heat absorbing body, a first heat dissipation body and at least two first tubes. The heat absorbing body is for being in thermal contact with a light source. The heat absorbing body is filled with a working fluid. The light source and the first heat dissipation body are disposed on a same side of the heat absorbing body, and the first heat dissipation body has a light transmitting space. The light transmitting space is for corresponding to the light source. Each of the first tubes connects the heat absorbing body and the first heat dissipation body. When the first heat dissipation body is located higher than the heat absorbing body and the working fluid absorbs the heat energy generated from the light source, the working fluid is evaporated from a liquid phase to a gas phase and flows to the first heat dissipation body through one of the two first tubes for dissipating heat, and the working fluid which is located in the first heat dissipation body is condensed from the gas phase into the liquid phase and flows to the heat absorbing body through the other one of the two first tubes.

In another embodiment, a lamp includes a case, at least one phase-change heat dissipating device and at least one light source. The case has a room and a light transmitting part which is located at a side of the room. The phase-change heat dissipating device is disposed in the room. The phase-change heat dissipating device includes a heat absorbing body, a first heat dissipation body and at least two tubes. The heat absorbing body is filled with a working fluid. The light source and the first heat dissipation body are disposed on a same side of the heat absorbing body, and the first heat dissipation body has a light transmitting space. Each of the tubes connects the heat absorbing body and the first heat dissipation body. When the first heat dissipation body is located higher than the heat absorbing body and the working fluid absorbs the heat energy of the light source, the working fluid is evaporated from a liquid phase to a gas phase and flows to the first heat dissipation body through one of the at least two first tubes for dissipating heat, and the working fluid which is located in the first heat dissipation body is condensed from the gas phase into the liquid phase and flows to the heat absorbing body through the other one of the at least two first tubes. The light source is in thermal contact with the heat absorbing body, and the light source is exposed from the light transmitting part and the light transmitting space.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
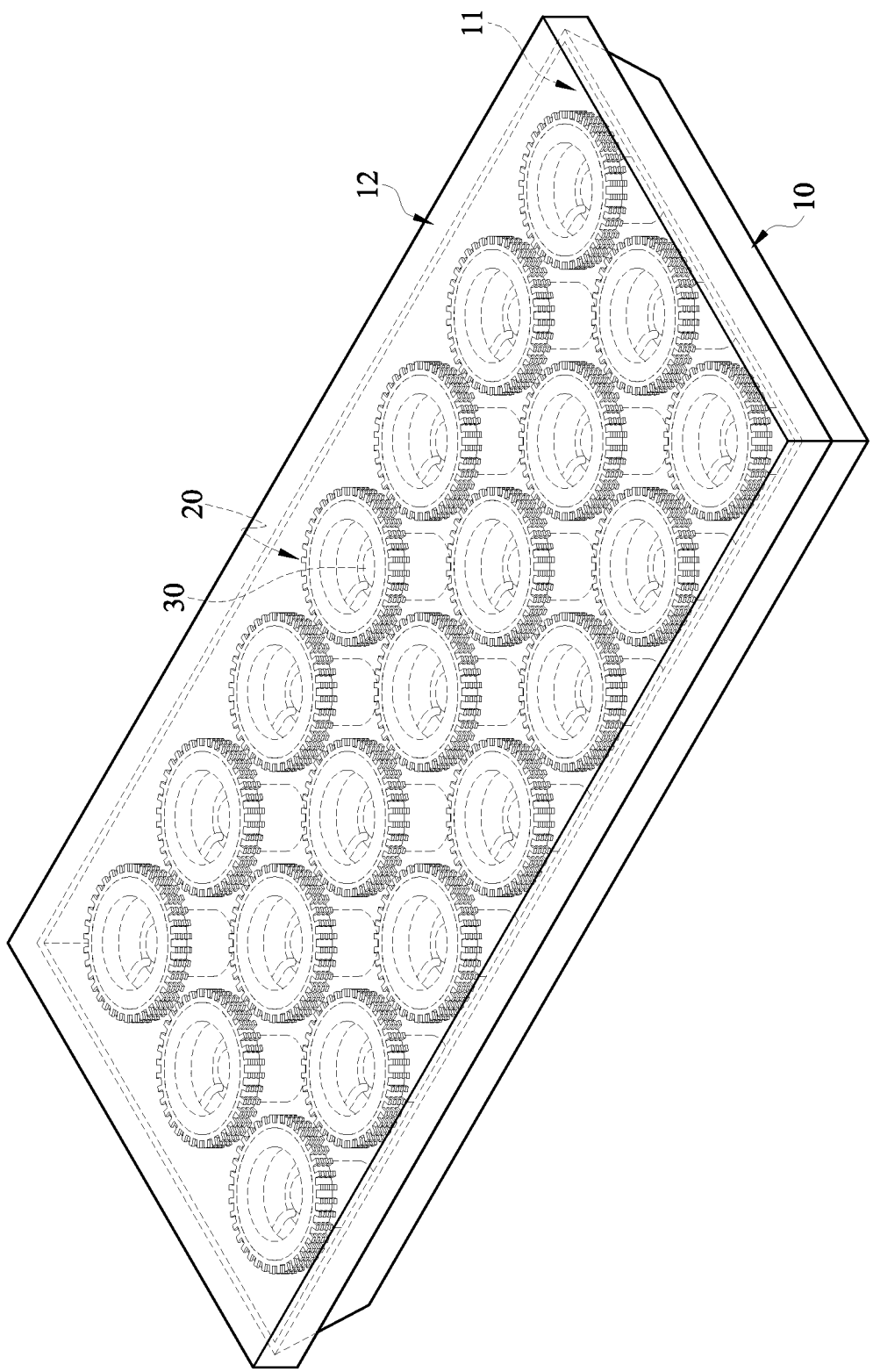
FIG. 1 is a perspective view of a lamp according to a first embodiment of the disclosure.
Figure 2:
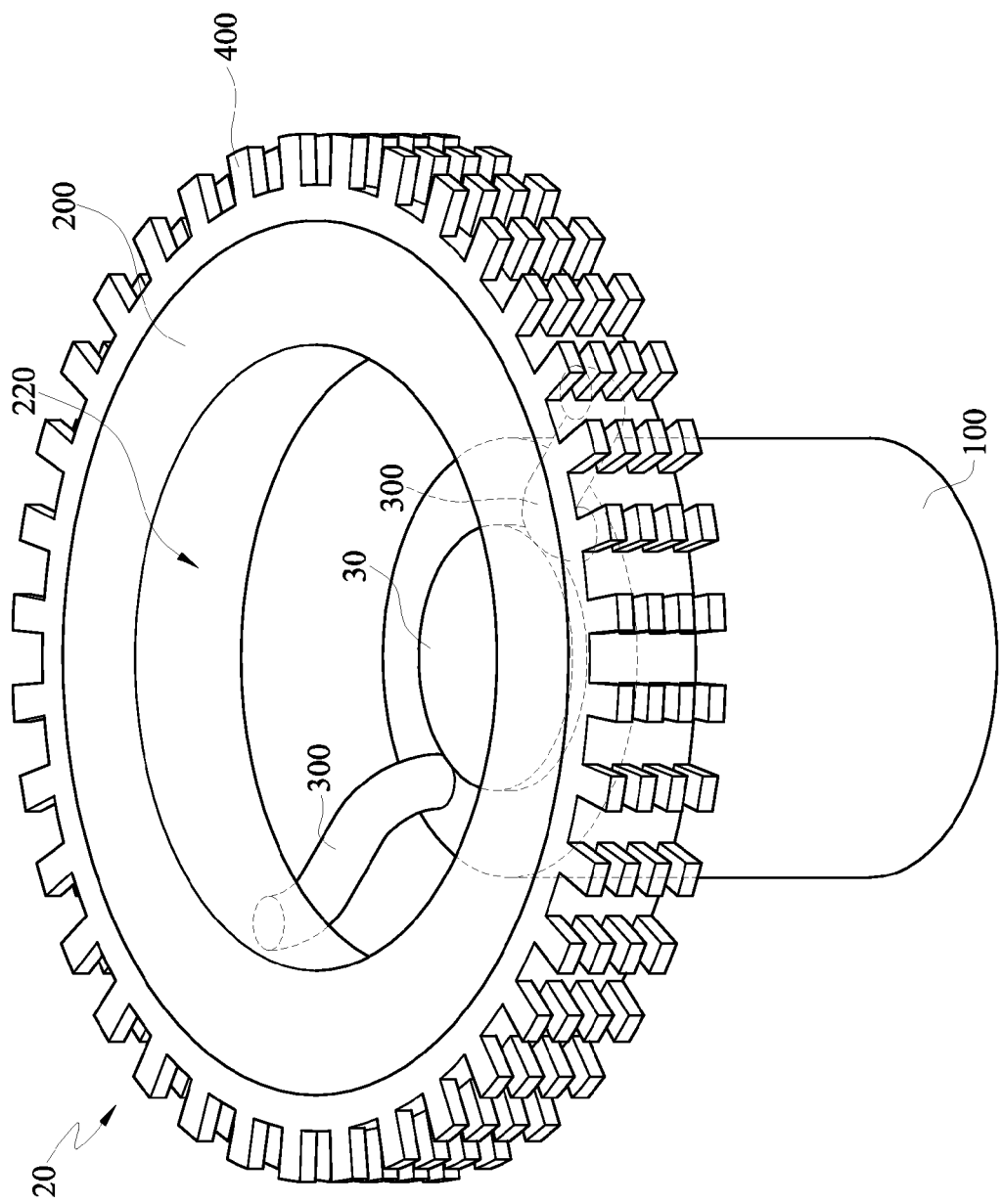
FIG. 2 is a perspective view of a phase-change heat dissipating device and a light source according to FIG. 1 of the disclosure.
Figure 3:
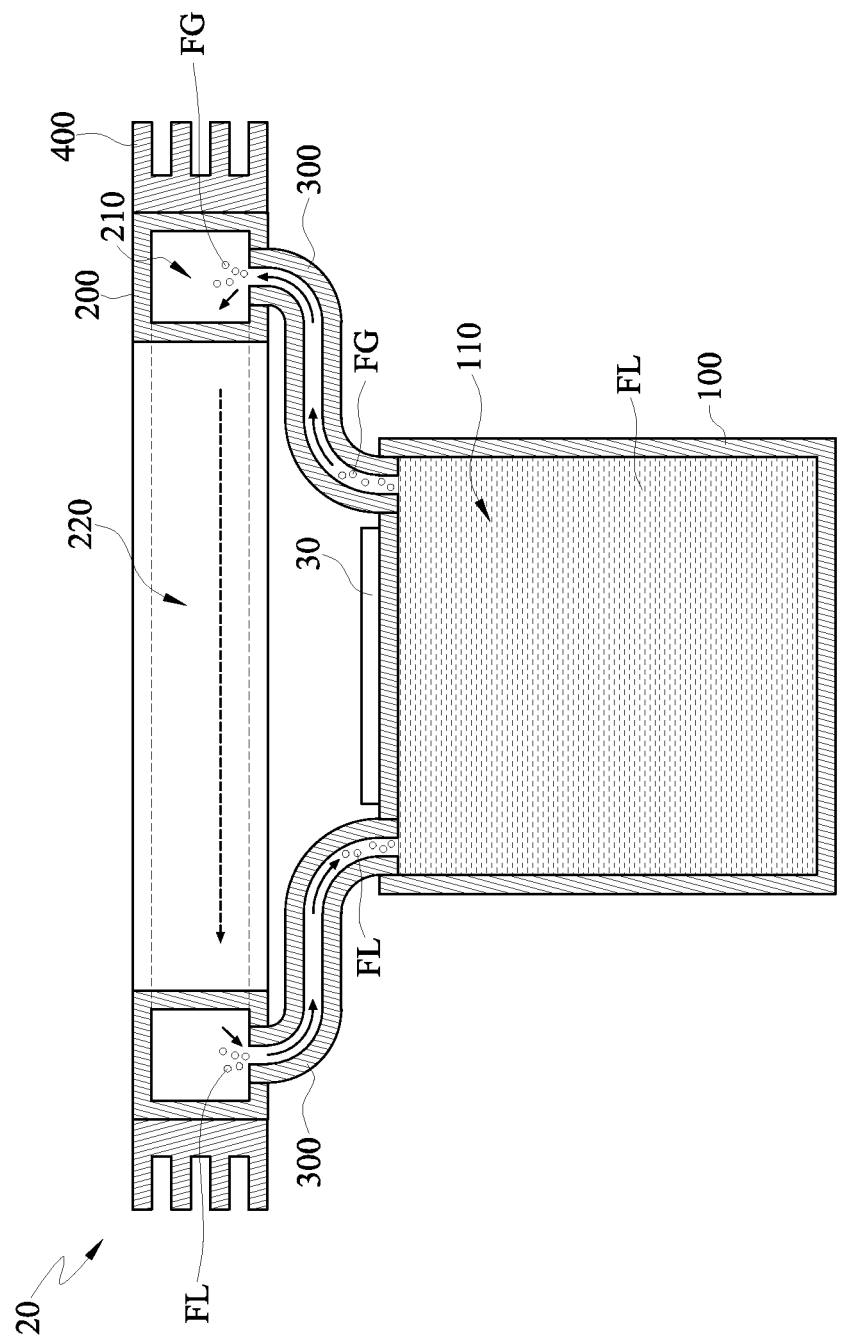
FIG. 3 is a cross-sectional view of the phase-change heat dissipating device and the light source according to FIG. 2 of the disclosure.

Please refer to FIG. 1 to FIG. 3. FIG. 1 is a perspective view of a lamp according to a first embodiment of the disclosure. FIG. 2 is a perspective view of a phase-change heat dissipating device and a light source according to FIG. 1 of the disclosure. FIG. 3 is a cross-sectional view of the phase-change heat dissipating device and the light source according to FIG. 2 of the disclosure. In this embodiment, a lamp 1 including a case 10, a plurality of phase-change heat dissipating devices 20 and a plurality of light sources 30.

The case 10 has a room 11 and a light transmitting part 12 which is located at a side of the room 11. The light transmitting part 12 is made of, for example, glass or plastic for being pervious to light.

The phase-change heat dissipating devices 20 are disposed in the room 11 and fixed in the case 10. Each phase-change heat dissipating device 20 includes a heat absorbing body 100, a first heat dissipation body 200 and a plurality of first tube 300.

The heat absorbing body 100 is made of, for example, metal, graphite or ceramics. The heat absorbing body 100 has a first chamber 110. The first chamber 110 is filled with a liquid-phase working fluid FL. In this embodiment, the liquid-phase working fluid FL is, for example, water. In other embodiments, working fluid FL is, for example, refrigerant, methanol, ethanol, ethyl ether or some other liquid materials which are for improving thermal conductivity. In this embodiment, the first chamber 110 is full of the working fluid FL, that is, the working fluid FL and the top of the heat absorbing body 100 which is attached to the light source 30 have no air therebetween for improving thermal conductivity of the working fluid FL.

The light source 30 is, for example, LED or tungsten light. The light source 30 is in thermal contact with the heat absorbing body 100.

The first heat dissipation body 200 is made of, for example, metal graphite, ceramics or some other materials having heat dissipating capability. The first heat dissipation body 200 has a second chamber 210. The first heat dissipation body 200 is, for example, ring-shaped, triangular ring-shaped, square ring-shaped or polygonal ring-shaped and surrounds a light transmitting space 220, that is, the light transmitting space 220 is defined by the first dissipation body 200. The light source 30 and the first heat dissipation body 200 are disposed on a same side of the heat absorbing body 100, and the light source 30 is exposed to the outside of the lamp 1 through the light transmitting space 220 and the light transmitting part 12, allowing light emitted by the light source 30 to penetrate the through light transmitting space 220 and travel out of the phase-change heat dissipating devices 20 via the light transmitting part 12.

Each of the tubes 300 connects the heat absorbing body 100 and the first heat dissipation body 200, allowing the first chamber 110 to be connected the second chamber 210. In addition, at least one of the tubes 300 is partially disposed higher than a liquid level of the working fluid FL, so that the gas-phase working fluid FG is able to flow into the first heat dissipation body 200 through the tubes 300.

In addition, the phase-change heat dissipating device 20 further includes a first heat sink 400. The first heat sink 400 is in thermal contact with the first heat dissipation body 200 for improving the efficiency of heat dissipating of the phase-change heat dissipating device 20.

Principle of heat dissipation of the lamp 1 will be depicted in the following description.

As shown in FIG. 3, when the light source 30 is turned on and the first heat dissipation body 200 is disposed higher than the heat absorbing body 100, heat energy generated from the light source 30 is able to be transmitted to the working fluid FL in the first chamber 110 via the heat absorbing body 100. The working fluid FL absorbs the heat energy generated from the light source 30 to be evaporated from a liquid phase to a gas phase. The gas-phase working fluid FG rises up and flows into the second chamber 210 of the first heat dissipation body 200 through one of the first tubes 300 according to physical characteristic of gas, and the heat energy is dissipated to the external environment through the first heat dissipation body 200 and the first heat sink 400. Then, in the second chamber 210, the gas-phase working fluid FG is gradually condensed into the liquid-phase working fluid FL during the dissipation of heat energy before flowing to the first chamber 110 of the heat absorbing body 100 through one of the first tubes 300 to form a cooling circulation automatically. Accordingly, the heat energy generated from the light source 30 is able to be automatically removed through the cooling circulation inside the phase-change heat dissipating devices 20.

In addition, because the aforementioned cooling circulation is automatically performed according to the physical characteristics of gas and without any assistance of a pump or some other active elements, the power consumption of the phase-change heat dissipating device 20 is reduced.

In this embodiment, because the light source 30 and the first heat dissipation body 200 are disposed on the same side of the heat absorbing body 100, and the first heat dissipation body 200 has the light transmitting space 220, the cooling circulation is automatically performed to remove the heat energy generated from the light source 30 when the lamp 1 with the phase-change heat dissipating device 20 is illuminating from a lower place to a higher place.

In the above embodiment, the quantity of the heat dissipation body 200 is one, and the first heat dissipation body 200 and the light source 30 are disposed on the same side of the heat absorbing body 100, but the disclosure is not limited thereto. For example, in other embodiments, the quantity of the heat dissipation body is greater than two, and the heat dissipation bodies are disposed on sides of the heat absorbing body that are different from each other, respectively.

Figure 4:
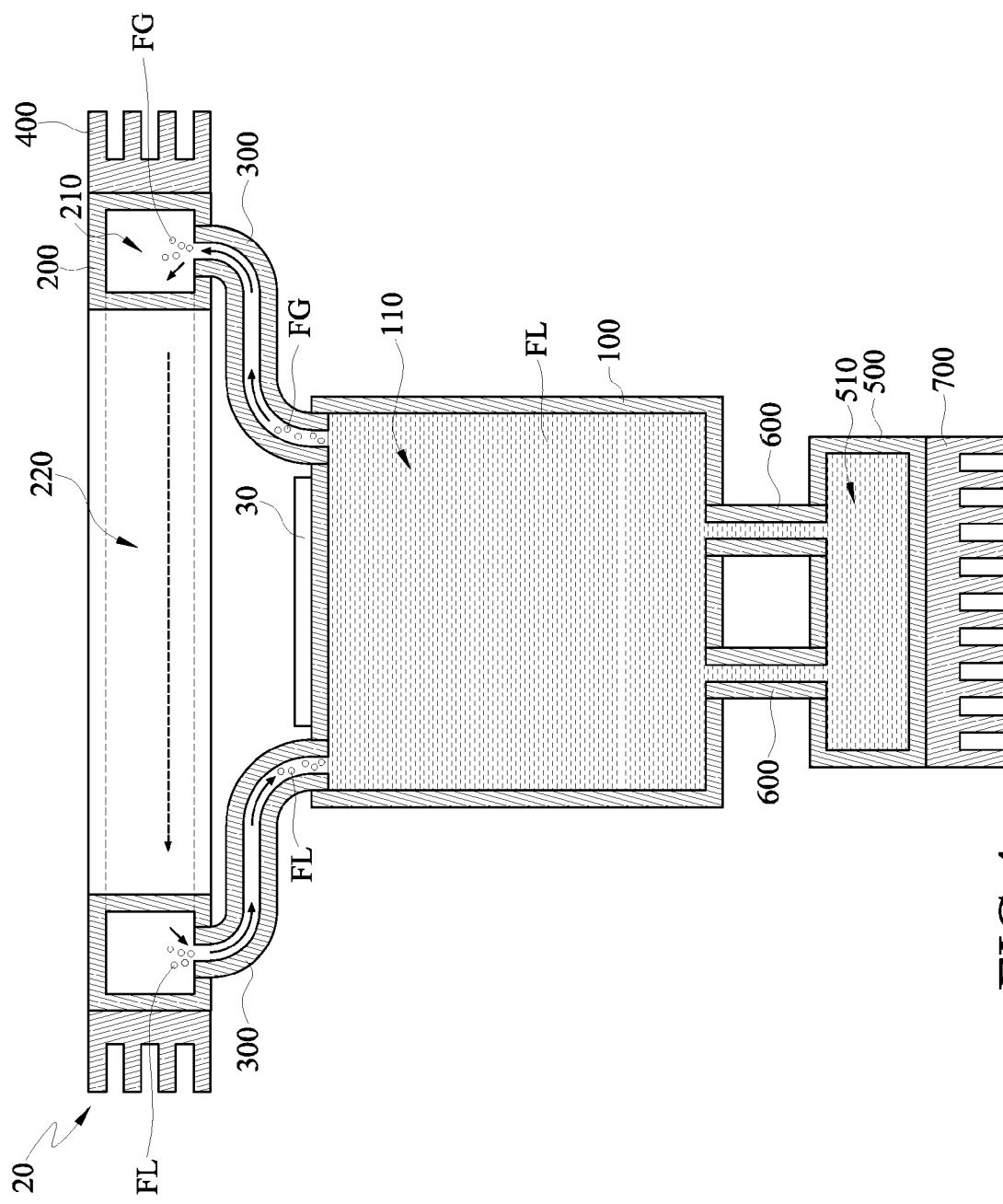
FIG. 4 is a cross-sectional view of a phase-change heat dissipating device according to a second embodiment of the disclosure.

Please refer to FIG. 4, which is a cross-sectional view of a phase-change heat dissipating device according to a second embodiment of the disclosure. As shown in FIG. 4, in this embodiment, the phase-change heat dissipating device 20a further includes a second heat dissipation body 500, a plurality of second tube 600 and a second heat sink 700. The first heat dissipation body 200 and the second heat dissipation body 500 are disposed on two sides of the heat absorbing body 100 that are opposite to each other. In other words, the heat absorbing body 100 is located between the first heat dissipation body 200 and the second heat dissipation body 500. The second heat dissipation body 500 has a third chamber 510. The second tube 600 connects the heat absorbing body 100 and the second heat dissipation body 500, allowing the first chamber 110 to be connected the third chamber 510. The second heat sink 700 is in thermal contact with the second heat dissipation body 500. In detail, both of the first heat dissipation body 200 and the light source 30 are disposed above the heat absorbing body 100, and the second heat dissipation body 500 is disposed beneath the heat absorbing body 100, thus the lamp (not shown) having the phase-change heat dissipating device 20a is able to be oriented in two different positions or directions to illuminate upward or downward.

Moreover, as shown in FIG. 4, because the second heat dissipation body 500 and the second tubes 600 are located lower than a liquid level of the working fluid FL, parts of the working fluid FL in the heat absorbing body 100 may flow into the second heat dissipation body 500 due to the gravity. Therefore, for example, in other embodiments, one-way valves are mounted in the first tubes 300 and the second tubes 600 for restricting the flow direction of the working fluid. In yet another embodiment, switching valves are mounted in the first tubes 300 and the second tubes 600 for controlling condition of the working fluid flowing in the first tubes 300 and the second tubes 600. In such a case, the switching valve is able to control whether the working fluid can flow through the switching valve. Accordingly, the working fluid FL flowing into the first heat dissipation body 200 or the second heat dissipation body 500 can be controlled so that the heat absorbing body 100 has a sufficient amount of the working fluid FL to perform desired thermal conductivity.

Figure 5:
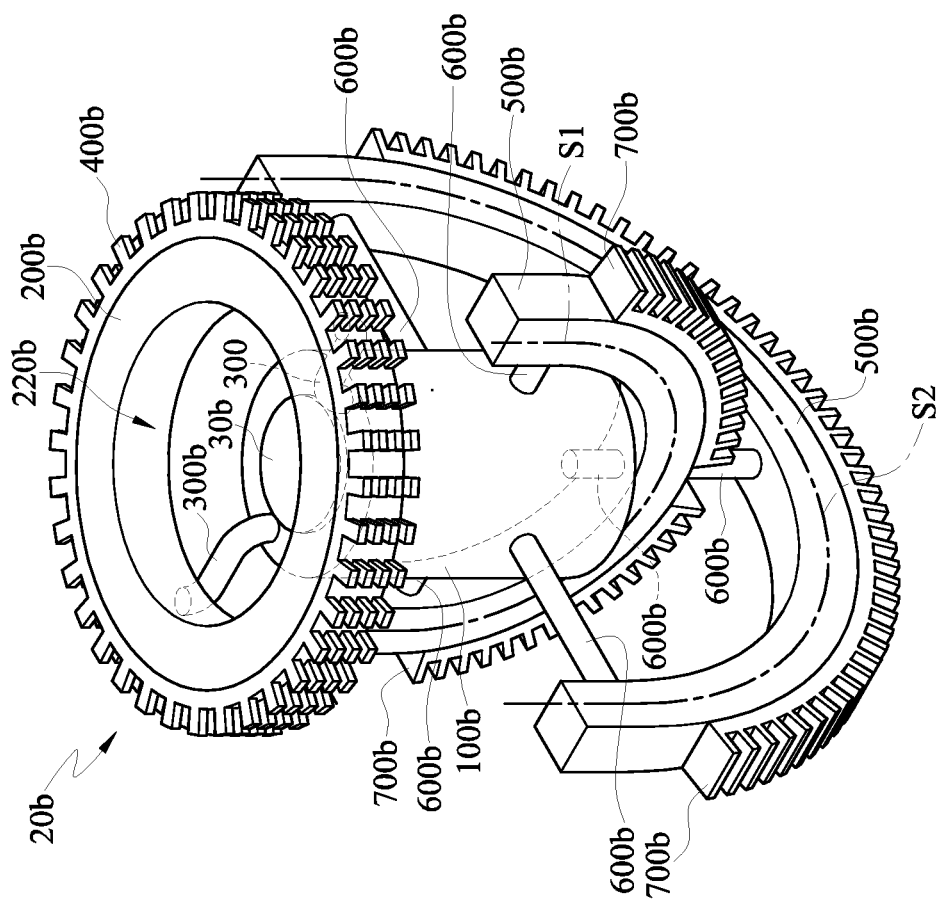
FIG. 5 is a perspective view of a phase-change heat dissipating device and a light source according to a third embodiment of the disclosure.
Figure 6:
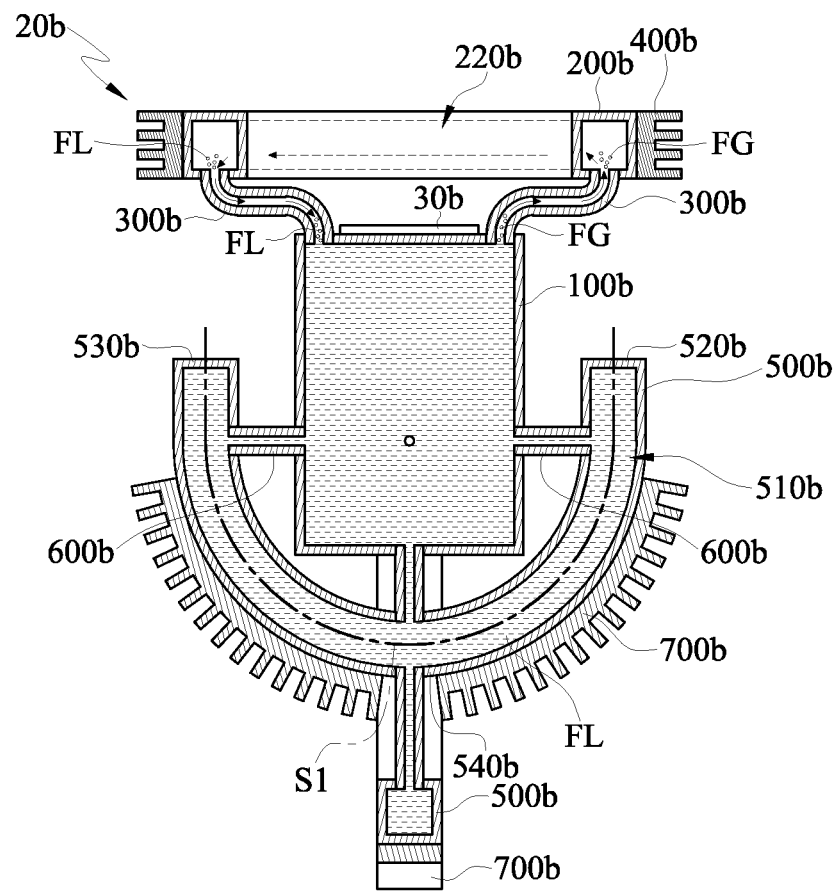
FIG. 6 is a cross-sectional view of the phase-change heat dissipating device and the light source according to FIG. 5 of the disclosure.

In the above embodiment, the second heat dissipation body 500 is cylindrical-shaped and disposed on a side of the heat absorbing body 100, but the disclosure is not limited to the shape and the position of the second heat dissipation body 500. In other embodiments, the second heat dissipation body 500 is bent and disposed on sides of the heat absorbing body 100 that are different from each other. Please refer to FIG. 5 and FIG. 6. FIG. 5 is a perspective view of a phase-change heat dissipating device and a light source according to a third embodiment of the disclosure. FIG. 6 is a cross-sectional view of the phase-change heat dissipating device and the light source according to FIG. 5 of the disclosure.

In this embodiment, a phase-change heat dissipating device 20b includes a heat absorbing body 100b, a first heat dissipation body 200b, a plurality of first tubes 300b, a first heat sink 400b, a plurality of second heat dissipation bodies 500b, a plurality of second tubes 600b and a plurality of second heat sinks 700b. The structures of the heat absorbing body 100b, the first heat dissipation body 200b, the first tubes 300b and the first heat sink 400b are similar to those of the heat absorbing body 100, the first heat dissipation body 200, the first tubes 300 and the first heat sink 400 depicted in FIG. 3 and thus the similar structures will not be further described.

The second heat dissipation body 500b is made of, for example, metal graphite, ceramics or some other materials having heat dissipating capability. Each second heat dissipation body 500b has a first end 520b and a second end 530b that are opposite to each other. The second heat dissipation body 500b has a third chamber 510b, and the third chamber 510b extends from the first end 520b to the second end 530b. The first end 520b and the second end 530b of each second heat dissipation body 500b are disposed on two sides of the heat absorbing body 100b that are adjacent to each other, respectively. In detail, the second heat dissipation bodies 500b are bent alone semi-circular arcs S1 and S2 to be U-shaped, respectively. In addition, the arcs S1 and S2 lie on two planes that are substantially orthogonal to each other, so that the first end 520b, the second end 530b and the middle section 540b of one of the second heat dissipation bodies 500b are sequentially disposed on a left side, a right side and a bottom side of the heat absorbing body 100b, respectively, and the first end 520b, the second end 530b and the middle section 540b of the other one of the second heat dissipation bodies 500b are sequentially disposed on a front side, a rear side and the bottom side of the heat absorbing body 100b, respectively.

In this embodiment, the second tubes 600b connect the heat absorbing body 100b and the first ends 520b of the two second heat dissipation bodies 500b, the heat absorbing body 100b and the second ends 530b of the two second heat dissipation bodies 500b, the heat absorbing body 100b and the middle sections 540b of the two second heat dissipation bodies 500b, respectively. To be more precisely, in this embodiment, the quantity of the second tubes 600b is five. One of the second tubes 600b connects the heat absorbing body 100b and the first end 520b of one of the two second heat dissipation bodies 500b. Another one of the second tubes 600b connects the heat absorbing body 100b and the second end 530b of one of the two second heat dissipation bodies 500b. Another one of the second tubes 600b connects the heat absorbing body 100b and the first end 520b of the other second heat dissipation body 500b. Another one of the second tubes 600b connects the heat absorbing body 100b and the second end 530b of the other second heat dissipation body 500b. The other one of the second tubes 600b connects the middle sections 540b of the two second heat dissipation bodies 500b. Therefore, the first chamber 110 is able to be connected to each third chamber 510b.

The light source 30b is, for example, LED or tungsten light. The light source 30b is in thermal contact with the heat absorbing body 100b.

In this embodiment, because that the first end 520b, the second end 530b and the middle section 540b of one of the second heat dissipation bodies 500b are sequentially disposed on the left side, the right side and the bottom side of the heat absorbing body 100b, respectively, and the first end 520b, the second end 530b and the middle section 540b of the other one of the second heat dissipation bodies 500b are sequentially disposed on the front side, the rear side and the bottom side of the heat absorbing body 100a, respectively, the lamp 1 having the phase-change heat dissipating device 20b is able to be oriented in different positions or directions to illuminate upward, downward, leftward, rightward, forward or rearward.

In this embodiment, the phase-change heat dissipating device 20b has one cylindrical first heat dissipation body 100b and two U-shaped second heat dissipation bodies 500b, but the disclosure is not limited to the above-mentioned shapes. In other embodiments, the phase-change heat dissipating device has one cylindrical first heat dissipation body 100b, one U-shaped second heat dissipation body 500b and one L-shaped heat dissipation body. In yet another embodiment, the phase-change heat dissipating device has one cylindrical first heat dissipation body 100b, one U-shaped second heat dissipation body 500b and one cylindrical second heat dissipation body 500 as shown in FIG. 4. Alternatively, the phase-change heat dissipating device has one cylindrical first heat dissipation body 100b and one U-shaped second heat dissipation body 500b.

According to the phase-change heat dissipating device and the lamp as discussed above, the ring-shaped first heat dissipation body and the light source are disposed on the same side of the heat absorbing body, allowing the cooling circulation to be performed automatically to remove the heat energy generated from the light source according to the principle of phase-change heat dissipation when the lamp with phase-change heat dissipating device is illuminating from a lower place to a higher place.

In addition, a plurality of heat dissipation bodies completely or partially surround a part of the peripheral of the heat absorbing body, allowing the cooling circulation to be performed automatically when the phase-change heat dissipating device is oriented in different positions or directions, so that heat energy generated from the light source is removed by using the principle of phase-change heat dissipation. Therefore, the cooling circulation is performed automatically when the lamp having the phase-change heat dissipating device is disposed in different positions or directions. Thus, the problem that the positions or directions of the conventional lamp being restricted is avoided.

What is claimed is:

1. A phase-change heat dissipating device, comprising:
a heat absorbing body for being in thermal contact with a light source, and the heat absorbing body filled with a working fluid;
a first heat dissipation body, the light source and the first heat dissipation body being disposed on a same side of the heat absorbing body, the first heat dissipation body having a light transmitting space, and the light transmitting space being for corresponding to the light source; and
at least two first tubes each connecting the heat absorbing body and the first heat dissipation body, when the first heat dissipation body is located higher than the heat absorbing body and the working fluid absorbs heat energy generated from the light source, the working fluid is evaporated from a liquid phase to a gas phase and flows into the first heat dissipation body through one of the at least two first tubes for dissipating heat, and the working fluid which is located in the first heat dissipation body is condensed from the gas phase into the liquid phase and flows to the heat absorbing body through the other one of the at least two first tubes.

2. The phase-change heat dissipating device according to claim 1, wherein the first heat dissipation body is ring-shaped and surrounds the light transmitting space.

3. The phase-change heat dissipating device according to claim 1, further comprising a first heat sink in thermal contact with the first heat dissipation body.

4. The phase-change heat dissipating device according to claim 1, further comprising a second heat dissipation body and at least two second tubes, the at least two second tubes each connecting the heat absorbing body and the second heat dissipation body, and the first heat dissipation body and the second heat dissipation body being disposed on two sides of the heat absorbing body that are opposite to each other, respectively.

5. The phase-change heat dissipating device according to claim 1, further comprising a second heat dissipation body, the first heat dissipation body and the second heat dissipation body are disposed on two sides of the heat absorbing body that are adjacent to each other, respectively.

6. The phase-change heat dissipating device according to claim 1, further comprising at least one second heat dissipation body, the at least one second heat dissipation body having a first end and a second end that are opposite to each other, and the first end and the second end of the at least one second heat dissipation body and the first heat dissipation body being disposed on three sides of the heat absorbing body that are different from each other, respectively.

7. The phase-change heat dissipating device according to claim 6, wherein the second heat dissipation body is bent along an arc.

8. The phase-change heat dissipating device according to claim 6, wherein the quantity of the at least one second heat dissipation body is two, the two second heat dissipation bodies are bent along two arcs, respectively, and the two arcs lie on two planes that are substantially orthogonal to each other, respectively.

9. The phase-change heat dissipating device according to claim 6, wherein the quantity of the at least one second heat dissipation body is two, the two second heat dissipation bodies are bent along two arcs lie on two planes that are substantially orthogonal to each other, respectively.

10. The phase-change heat dissipating device according to claim 1, further comprising a plurality of second heat dissipation bodies, the first heat dissipation body and the plurality of second heat dissipation bodies being disposed on three sides of the heat absorbing body that are different from each other, respectively.

11. The phase-change heat dissipating device according to claim 1, wherein at least one of the at least two first tubes is located higher than a liquid level of the working fluid.

12. A lamp, comprising:
a case having a room and a light transmitting part located at a side of the room;
at least one phase-change heat dissipating device disposed in the room and comprising:
a heat absorbing body filled with a working fluid;
a first heat dissipation body, and the first heat dissipation body having a light transmitting space; and
at least two tubes each connecting the heat absorbing body and the first heat dissipation body; and
at least one light source being in thermal contact with the heat absorbing body, the light source and the first heat dissipation body being disposed on a same side of the heat absorbing body, and the light source being exposed from the light transmitting part and the light transmitting space, when the first heat dissipation body is located higher than the heat absorbing body and the working fluid absorbs heat energy of the light source, the working fluid is evaporated from a liquid phase to a gas phase and flows to the first heat dissipation body through one of the at least two tubes for dissipating heat, and the working fluid which is located in the first heat dissipation body is condensed from the gas phase into the liquid phase and flows to the heat absorbing body through the other one of the at least two tubes.

* * * * *